United States Patent [19]

Rollett

[11] 3,805,178

[45] Apr. 16, 1974

[54] RC ACTIVE FILTER CIRCUIT

[75] Inventor: John Mortimer Rollett, Ealing, England

[73] Assignee: The Post Office, London, England

[22] Filed: Aug. 25, 1972

[21] Appl. No.: 283,772

[52] U.S. Cl. .................. 330/107, 328/167, 330/109

[51] Int. Cl. .................. H03f 1/36

[58] Field of Search ......... 330/21, 31, 107, 109, 69; 328/167

[56] References Cited

UNITED STATES PATENTS 3,582,806 6/1971 Le Dily .......................... 330/107 X

OTHER PUBLICATIONS

Handbook of Operational Amplifier Active RC Networks, Burr-Brown Research Corp., second Edition, 1966 pages 35–42

Moschytz, "Inductorless Filters: A Survey II. Linear Active and Digital Fictons," IEEE Spectrum September, 1970 pp. 63–67

*Primary Examiner*—Herman Karl Saalbach
*Assistant Examiner*—James B. Mullins
*Attorney, Agent, or Firm*—Kemon, Palmer & Estabrook

[57] ABSTRACT

The invention comprises an RC active filter circuit, which includes an operational amplifier, and which depending on the circuit topography may function as either a band-pass, or low-pass filter. The circuit has a capacitive network connected between the inverting input of the operational amplifier and earth. This network in conjunction with the feedback network operates to make the feedback, frequency dependent. The frequency dependence of the feedback is adjusted to compensate for variations in the gain of the amplifier with frequency, to give a working range in which the closed loop gain of the amplifier is independent of the frequency.

8 Claims, 3 Drawing Figures

PATENTED APR 16 1974 3,805,178

RC ACTIVE FILTER CIRCUIT

The invention relates to an RC active filter circuit.

An important problem in the design of precision RC active filters, using operational amplifiers, is the finite bandwidth over which the gain of the amplifier remains high enough to be neglected. If an active filter for example a quadratic filter is designed assuming the frequency dependence of the amplifier gain is negligible, then at high enough frequencies the performance of the stage will begin to depart from the calculated performance.

The term "an RC active filter circuit having a high frequency cut-off" as used in the disclosure and claims of this specification, is intended to include within its scope both low-pass and band-pass filters.

It is an object of the present invention to compensate for the discrepancy between observed frequency response of an RC active filter network using operational amplifiers and the expected frequency response caused by the existence of a dominant pole in the amplifier response.

According to the present invention there is provided an RC active filter circuit having a high frequency cut-off, including an operational amplifier having an inverting input, a non-inverting input and an output, said operational amplifier being provided with feedback by way of a first resistive impedance unit connected between the output of the said operational amplifier and the inverting input of the said operational amplifier and a second resistive impedance unit in parallel with a first capacitor between the inverting input and earth.

The invention will now be described by way of example with reference to the accompanying diagramatic drawings in which.

Figure 1:
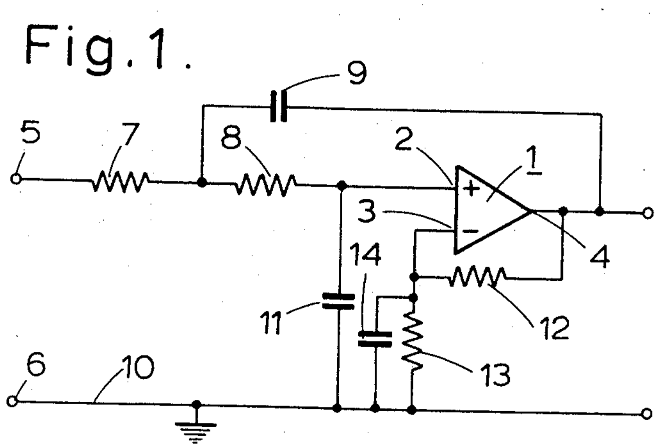
FIG. 1 shows a low pass second order filter stage which is frequency compensated according to the present invention.
Figure 3:
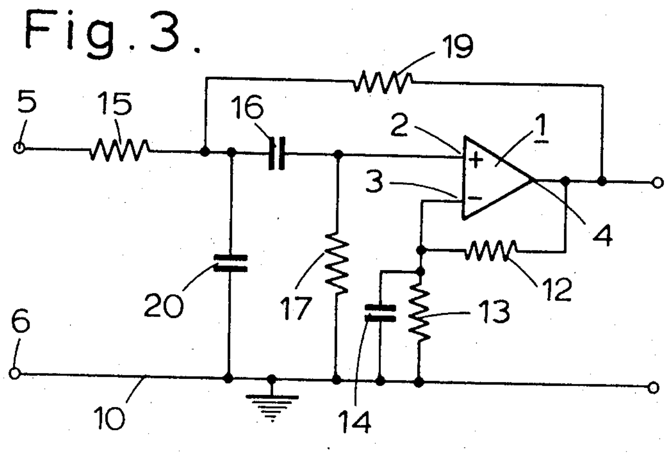

FIG. 3 also shows a band pass filter stage incorporating frequency compensation:

Referring now to the drawing FIG. 1 shows an operational amplifier 1 having a non-inverting input terminal 2, and inverting input terminal 3 and an output terminal 4. The input to the filter is applied across terminals 5 and 6. Terminal 5 is connected by way of resistors 7 and 8 in series to the non-inverting input 2 of the amplifier 1. The junction between the resistors 7 and 8 is connected by way of a capacitor 9 to the output 4. The non-inverting input terminal 2 is connected to an earthed line 10 from the terminal 6 by way of a capacitor 11. The inverting input of the amplifier 1 is connected to the output terminal 4 by way of a resistor 12 and is also connected to the line 10 by way of a resistor 13 and a capacitor 14 in parallel.

It will be appreciated that, in general, circuits employing operational amplifiers are designed to minimise capacitance between earth and the inverting input. This is because normally a capacitive coupling between the inverting input and ground will lead to high frequency instability as the gain of the amplifier rises theoretically to infinity at high frequencies. In the present invention where a capacitive coupling is deliberately provided between earth and the inverting input other components are also provided to yield a low-pass filter circuit, and the circuit, as a whole, does not suffer from the high frequency stability problems. Similar network modifications apply also to band-pass filter circuits using op-amps, but not to high-pass filter circuits.

In the general case of an RC filter containing an operational amplifier which is not provided with the present invention, the closed loop gain is approximated by the expression.

$$R_1 + R_2/R_2 \quad (1)$$

where $R_1$ is the resistance of the resistor 12

$R_2$ is the resistance of the resistor 13

The closed loop gain may be more accurately stated as $$\frac{1}{\dfrac{R_2}{R_1+R_2}+\dfrac{1}{K}} \quad (2)$$

where:

$K$ is the open loop gain of the amplifier.

In practice the open loop gain falls off with frequency and can be approximated by the expression involving a single dominant pole as $$K = K_o/1 + (s/s_1) \quad (3)$$

where $s$ is the complex frequency variable, $s_1$ is the dominant pole, $K_o$ is the open loop gain at very low frequencies — and is very high.

If the circuit parameters are defined as follows:

$$T = 1/K_o s_1 \quad (4)$$

$$\mu = R_1 + R_2/R_2 \quad (5)$$

$$1/\mu' = 1/\mu + 1/K_o \quad (6)$$

$$T' = \mu' T \quad (7)$$

then the accurate expression for closed loop gain is $$\mu'/(1+sT') \quad (8)$$

From the above equation it is evident that the closed-loop gain falls off with frequency, and is 3dB down when the frequency is $(1/T')$.

The present invention provides a method for off setting the fall off of closed loop gain with frequency. The capacitor 14 is included in parallel with the resistor 13 so that the feed-back is frequency dependent and in the above expressions $R_2$ can be replaced by:

$$R_2/1+sC_2R_2 \quad (9)$$

The closed loop gain therefore becomes:

$$\mu' \ (1+sC_2R')/1+sT'+fs^2T'C_2R' \quad (10)$$

Assuming $K_o>>1$.

where $R' = R_1 R_2/(R_1 + R_2)$ and $C_2$ is the capacitance of the capacitor 14.

If the value of $C_2$ is chosen so that $$C_2 R' = T' \quad (11)$$

then at low frequencies gain will remain substantially constant and the effect of the capacitor will be to retain the gain substantially constant at high frequencies although at very high frequencies the gain will fall off as shown by equation (10).

If, $C_2$ is chosen so that $$C_2 R' = ET' \quad (12)$$

i.e., in terms of $R_1$, $R_2$, $s_1$, $K_o$, $E$ $$|C_2| = E\,(R_1 + R_2)^2/s_1 R_1, R_2[R_2(K_o + 1) + R_1]$$

where E lies in the range $0.5 < E \leq 2$ However if resistance 13 is omitted, i.e., if $R_2$ is infinite in value then $$|C_2| = E/s_1\, R_1\, (K_o + 1)$$

If $C_2$ is given by either of the above expressions, the closed loop gain is given by $$\mu'\,(1 + EsT')/1 + sT' - Es^2T'^2 \quad (13)$$

for behaviour at real frequencies put s = jw to obtain obtain $$\mu'\,(1 + jE\,wI')/1 + jwT' - Ew^2T'^2 \quad (14)$$

the magnitude of the gain is therefore given by $$\mu\sqrt{[1 + E^2\,(wT')^2/1 + (1-2E)(wT')^2 + E^2(wT')^4]} \quad (15)$$

and the phase is given by Φwhere;

$$\tan \Phi = -(wT')\,[1-E+E^2\,(wT')^2] \quad (16)$$

hence if E is varied by varying $C_2$ it is possible to adjust the closed-loop gain or phase by a small amount so as to achieve a desired effect in particular to achieve a required response from an active filter stage. Thus E may be chosen to correct for variations in circuit performance due to components tolerances. In practice, the most likely range for E is $0.5 \leq E \leq 2$ preferably $E \sim 1$. This enables $C_2$ to be changed by a factor of 2 in either direction. This method when applicable to low-pass filters is particularly useful as the d.c. or very low frequency response of the filter is unaffected while the response in a frequency range of special interest, for example, the pass-band edge, is being adjusted or being corrected. A practical advantage of this method of adjustment is that the resistors 12 and 13 can be chosen so that the range of values over which the capacitor 14 may be required to vary suits the particular type of capacitor which is being used. For example, if a particular type of capacitor is available in values between 10pF and 100pF, a value of R' of say 10k ohms may be appropriate. However, if the capacitor 14 is available in values between 3pF and 30pF then the value of R' may be, for example, 33K ohms. A further advantage is that the temperature coefficient of the capacitor 14 may be chosen so that the performance of the filter stage remains independent of temperature changes. Similar network modifications also apply to the case of band-pass filter circuits.

The method of frequency compensation described theoretically above, will now be applied practically in the following example. An active filter stage design to realise a low-pass second-order transfer function of $$1/1 + 0.333s + s^2 \quad (17)$$

having a Q of 3, with the amplifier gain at +2, has the following circuit element values for the circuit of FIG. 1;

Resistance of the resistor 7 = 8k ohms

Resistance of the resistor 8 = 24k ohms

Resistance of the resistor 12 = 48k ohms

Resistance of the resistor 13 = 48k ohms

Capacitance of the capacitor 9 = 6 nF

Capacitance of the capacitor 11 = 2nF

The circuit was designed to have a frequency and gain at the maximum of the response of 3222Hz and 1-5.7dB respectively. The circuit was built with a first amplifier (A) of unity-gain bandwidth 0.45 MHz, and secondly with an amplifier (B) with unity gain bandwidth of 0.188MHz. It was found that in the case of amplifier (A) if the capacitor 14 was not included the frequency was reduced by 1.2 percent to 3183Hz and the gain rose to 15.8dB and in the case of the second amplifier (B) the frequency was reduced by 3.2 percent to 3118Hz and the gain rose to 15.9dB. When the capacitor 14 was introduced having a capacitance in the case of amplifier A of 20pF, and in the case of amplifier (B) having a value of 71,F, both of which capacitances were calculated from the equations (11) and (12) above the circuit operated substantially according to design with the frequency corrected to 3222Hz ± 3Hz while the gain was corrected in each case to 15.7dB.

Figure 2:
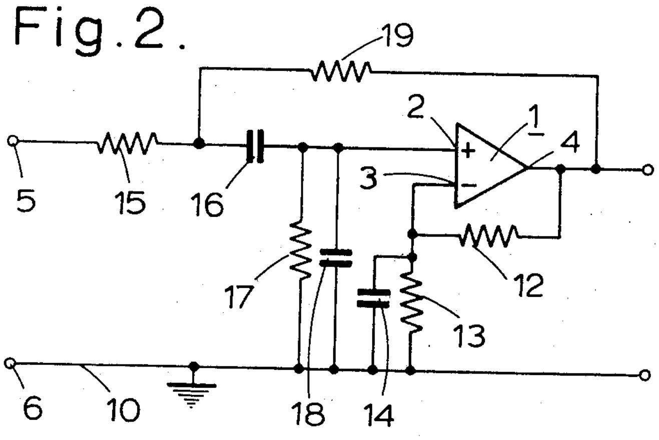
FIG. 2 shows a band pass filter stage incorporating frequency compensation.

Referring now to FIGS. 2 and 3 which show band-pass filters the components for frequency compensation have been given the same reference numerals as in FIG. 1 as their action and effect on the frequency response is similar. In FIG. 2 the band-pass circuit components consist of: a resistor 15 and capacitor 16 in series between the terminal 5 and the input terminal 2 of the amplifier 1; a resistor 17 and a capacitor 18 in parallel between terminal 2 and the line 10; and a resistor 19 between the output 4 and the junction between the resistor 15 and capacitor 16. In FIG. 3 the component topography is very similar to that in FIG. 2, however the capacitor 18 is omitted and a capacitor 20 is included between the earthed line 10 and the junction between the resistor 15 and capacitor 16.

The operation of the band-pass filter stages and the frequency compensation network will be appreciated from the foregoing theoretical analysis of the circuit of FIG. 1. The dimensioning of the band-pass components may be selected to achieve the desired pass-band.

Although the above example illustrates the invention applied to a specific low-pass filter network and a band-pass filter it will be appreciated that other low-pass and band-pass RC active filter stages using an operational amplifier with a closed-loop gain greater than zero may be adjusted to achieve desired response by means of an additional capacitor between the inverting input of the amplifier and earth.

I claim:

1. An RC active filter circuit having a high frequency cut-off including an operational amplifier having an inverting input, a non-inverting input, and an output, said operational amplifier being provided with feedback by way of a first resistive impedance unit connected between the output of the said operational amplifier and the inverting input of said operational amplifier, and a second resistive impedance unit in parallel with a first capacitor between the inverting input and earth, the said operational amplifier having an open loop gain in which there is a dominant pole, and the first capacitor having a capacitance in the range defined by:

$$|C_2| = E\,(R_1 + R_2)\,^2/s_1R_1R_2\,[R_2(R_o + 1) + R_1]$$

the first resistive impedance unit having a resistance of $R_1$, the second resistive impedance unit having a resistance of $R_2$, the said operational amplifier having an open loop gain which, when a signal applied to the said operational amplifier has a frequency approaching a limit value of zero, asymptotically approaches $K_0$, the dominant pole occurring at a complex frequency of $s_1$ which in the above equation is a negative real number, and E is a parameter having any value in the range $0.5 \leqslant E \leqslant 2$.

2. An RC active filter circuit as claimed in claim 1 in which a second capacitor is connected between the non-inverting input and earth.

3. An RC active filter circuit as claimed in claim 2 arranged to operate as a low-pass filter stage, in which a third and fourth resistive impedance unit are connected in series to the non-inverting input of the said operational amplifier and the output of said operational amplifier is connected by way of a third capacitor to a junction between the third and fourth resistive impedance units.

4. An RC active filter circuit as claimed in claim 2 arranged to operate as a band-pass filter stage, in which a third resistive impedance unit and a third capacitor are connected in series to the non-inverting input of the said operational amplifier and the output of said operational amplifier is connected by way of a fourth resistive impedance unit to a junction between the third resistive impedance unit and the third capacitor.

5. An RC active filter circuit having a high frequency cut-off including an operational amplifier having an inverting input, a non-inverting input, and an output, said operational amplifier being provided with feedback by way of a first resistive impedance unit connected between the output of the said operational amplifier and the inverting input of the said operational amplifier, a first capacitor between the inverting input and earth, a second resistive impedance unit connected in parallel with said first capacitor between said inverting input and earth, and a second capacitor connected between said non-inverting input and earth.

6. An RC active filter circuit as claimed in claim 5 arranged to operate as a low-pass filter stage, in which a third and fourth resistive impedance unit are connected in series to the non-inverting input of the said operational amplifier and the output of the said operational amplifier is connected by way of a third capacitor to a junction between the third and fourth resistive impedance units.

7. An RC active filter circuit as claimed in claim 5, arranged to operate as a band-pass filter stage, in which a third resistive impedance unit and a fourth capacitor are connected in series to the non-inverting input of the said operational amplifier and the output of the said operational amplifier is connected by way of a fourth resistive impedance unit to a junction between the third resistive impedance unit and the fourth capacitor.

8. An RC active filter circuit as claimed in claim 5 in which the said operational amplifier has an open loop gain in which there is a dominant pole, and the first capacitor has a capacitance in the range defined by:

$$|C_2| = E/s_1R_1\ (K_0 + 1)$$

the first resistive impedance unit has a resistance of $R_1$, the said operational amplifier has an open loop gain which, when a signal applied to the said operational amplifier has a frequency approaching a limit value of zero, asymptotically approaches $K_0$, the dominant pole occurs at a complex frequency $s_1$ which in the above equation is a negative real number, and E is a parameter having any value in the range $0.5 \leqslant E \leqslant 2$.

* * * * *

UNITED STATES PATENT OFFICE

CERTIFICATE OF CORRECTION

Patent No. 3,805,178 Dated April 16, 1974

Inventor(s) JOHN MORTIMER ROLLETT

It is certified that error appears in the above-identified patent and that said Letters Patent are hereby corrected as shown below:

[30] Foreign Application Priority Data

September 6, 1971 Great Britain 41547/71

Signed and sealed this 10th day of September 1974.

(SEAL)
Attest:

McCOY M. GIBSON, JR.
Attesting Officer

C. MARSHALL DANN
Commissioner of Patents